(12) United States Patent
Tseng et al.

(10) Patent No.: US 7,445,993 B2
(45) Date of Patent: Nov. 4, 2008

(54) METHOD OF FABRICATING NON-VOLATILE MEMORY

(75) Inventors: Wei-Chung Tseng, Hsinchu (TW); Houng-Chi Wei, Hsinchu (TW); Saysamone Pittikoun, Hsinchu County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 239 days.

(21) Appl. No.: 11/306,254

(22) Filed: Dec. 21, 2005

(65) Prior Publication Data

US 2006/0286749 A1 Dec. 21, 2006

(30) Foreign Application Priority Data

Jun. 15, 2005 (TW) .............................. 94119775 A

(51) Int. Cl.
*H01L 21/337* (2006.01)
(52) U.S. Cl. ................ 438/257; 438/279; 257/E21.638
(58) Field of Classification Search ................ 438/257, 438/279; 257/E21.638
See application file for complete search history.

(56) References Cited

U.S. PATENT DOCUMENTS

| 4,939,690 | A |  | 7/1990 | Momodomi et al. ... 365/185.17 |
| 5,930,631 | A |  | 7/1999 | Wang et al. ................. 438/286 |
| 7,285,450 | B2 | * | 10/2007 | Tseng et al. ................. 438/195 |
| 2006/0039200 | A1 | * | 2/2006 | Yang et al. ............. 365/189.01 |
| 2006/0197145 | A1 | * | 9/2006 | Pittikoun et al. ............. 257/316 |
| 2006/0286752 | A1 | * | 12/2006 | Tseng et al. ................. 438/279 |

* cited by examiner

*Primary Examiner*—W. David Coleman
(74) *Attorney, Agent, or Firm*—Jianq Chyun IP Office

(57) ABSTRACT

A method of fabricating non-volatile memory is provided. A plurality of first memory cells is formed on the memory cell region of a substrate. Each first memory cell comprises a first composite layer, a first gate and a cap layer. There is a gap between two adjacent first memory cells. Then, a plurality of gates is formed in the respective gaps. The gates together with a second composite layer form a plurality of second memory cells. The second memory cells and the first memory cells together constitute a memory cell column. In the meantime, a plurality of gate structures is also formed on the peripheral circuit region. The gates in the gaps and the gates in the peripheral circuit region are fabricated using different conductive layers.

19 Claims, 7 Drawing Sheets

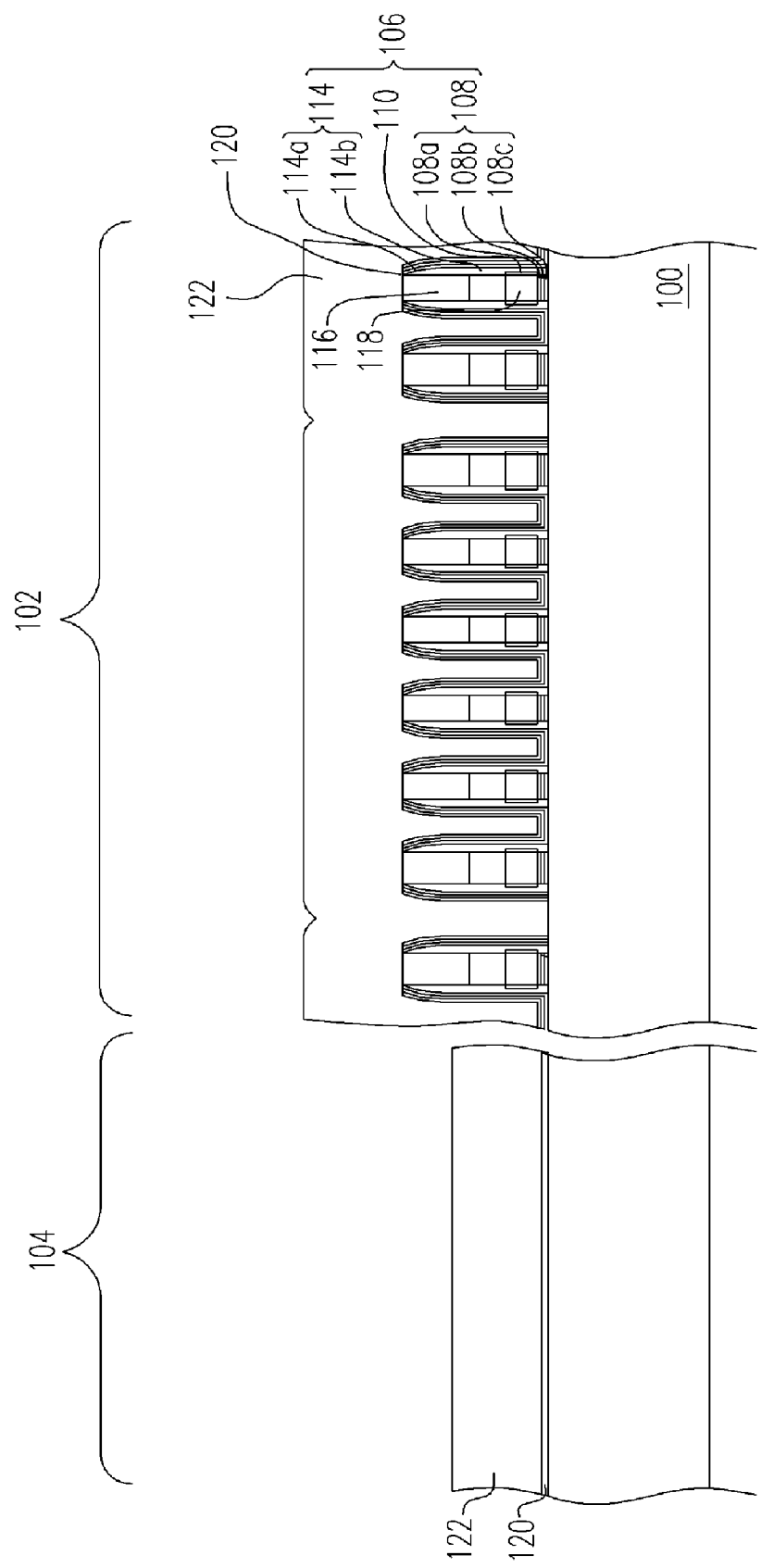

METHOD OF FABRICATING NON-VOLATILE MEMORY

CROSS-REFERENCE TO RELATED APPLICATION

This application claims the priority benefit of Taiwan application serial no. 94119775, filed on Jun. 15, 2005. All disclosure of the Taiwan application is incorporated herein by reference.

BACKGROUND OF THE INVENTION

1. Field of the Invention

The present invention relates to a method of fabricating memory. More particularly, the present invention relates to a method of fabricating non-volatile memory.

2. Description of the Related Art

Among the non-volatile memory products, electrically erasable and programmable read-only-memory (EEPROM) is a device that allows multiple data entry, reading and erasing operations. In addition, the stored data will be retained even after power to the device is removed. With these advantages, the memory device has been broadly applied in personal computer and electronic equipment.

In U.S. Pat. No. 4,939,690, a flash memory structure having a floating gate and a control gate fabricated using doped polysilicon is provided. To prevent the misjudgement errors due to the over-erasure of the flash memory in the erasing operation, additional select gates are formed on the sidewalls of the control gates and the floating gates and over the substrate to form the so-called split-gate structure.

Moreover, charge storage layers sometimes replaces the polysilicon floating gates in the conventional design technique. The charge storage layer is fabricated using silicon nitride, for example. In general, the silicon nitride charge storage layer is sandwiched between a top and a bottom silicon oxide layer to form an oxide/nitride/oxide (ONO) composite layer. A device having this type of structure is often called a silicon/oxide/nitride/oxide/silicon (SONOS) device. In U.S. Pat. No. 5,930,631, a SONOS device having a split-gate structure has been disclosed.

However, the aforementioned SONOS device with split-gate structure needs more memory space because a larger split-gate area is required to accommodate the split gate structure. Therefore, the SONOS device has memory cells with a size much greater than that of the stack gate EEPROM. In other words, it is difficult to increase the level of integration of the SONOS device with split-gate cell structures any further.

SUMMARY OF THE INVENTION

Accordingly, at least one objective of the present invention is to provide a method of fabricating a non-volatile memory capable of increasing the level of integration of memory cells.

At least a second objective of the present invention is to provide a method of fabricating non-volatile memory capable of increasing the memory storage capacity, simplifying the fabricating process and lowering the production cost.

To achieve these and other advantages and in accordance with the purpose of the invention, as embodied and broadly described herein, the invention provides a method of fabricating non-volatile memory. First, a substrate that can be divided into at least a memory cell region and a peripheral circuit region is provided. Then, a plurality of first memory cells is formed on the substrate in the memory cell region. There is a gap between every two adjacent first memory cells. Thereafter, a plurality of second composite layers is formed over the substrate each comprising a second charge storage layer. After that, a first conductive layer is formed over the substrate to cover the first memory cells and fill up the gaps. Then, a removing step is carried out to remove a portion of the first conductive layer and the second composite layers and form a plurality of second gates that fills the gaps in the memory cell region. The second gates and the second composite layers together form a plurality of second memory cells. The second memory cells together with the first memory cells form a first memory cell column. Thereafter, a gate dielectric layer is formed over the substrate in the peripheral circuit region. A second conductive layer is formed over the substrate to cover the gate dielectric layer in the peripheral circuit region and the first memory cell columns in the memory cell region. Then, a dielectric layer is formed over the second conductive layer. The dielectric layer and the second conductive layer are patterned to form a plurality of gate structures in the peripheral circuit region and remove the dielectric layer and the second conductive layer in the memory cell region. After that, a source/drain region is formed in the substrate on the respective sides of the first memory cell column.

According to the aforementioned method of fabricating non-volatile memory in the embodiment of the present invention, the removing step includes performing an etching process using the first memory cells as an etching stop layer.

According to the aforementioned method of fabricating non-volatile memory in the embodiment of the present invention, spacers are formed on the sidewalls of the first memory cells before forming the second composite layers.

According to the aforementioned method of fabricating non-volatile memory in the embodiment of the present invention, after forming the first gate structures but before forming the spacers, further includes forming a liner oxide layer on the respective sidewalls of the first memory cells.

According to the aforementioned method of fabricating non-volatile memory in the embodiment of the present invention, the process of forming the liner oxide layer includes performing a rapid thermal oxidation.

According to the aforementioned method of fabricating non-volatile memory in the embodiment of the present invention, after performing the removing step but before forming the gate dielectric layer in the peripheral circuit region, further includes cleaning the substrate in the peripheral circuit region.

According to the aforementioned method of fabricating non-volatile memory in the embodiment of the present invention, the substrate in the peripheral circuit region is cleaned using a hydrofluoric acid solution.

According to the aforementioned method of fabricating non-volatile memory in the embodiment of the present invention, the method of forming source/drain regions in the substrate includes performing an ion implant process.

According to the aforementioned method of fabricating non-volatile memory in the embodiment of the present invention, the method further includes forming a second memory column next to the first memory column on the substrate.

According to the aforementioned method of fabricating non-volatile memory in the embodiment of the present invention, the distance between the first memory cell column and the second memory cell column is wider than the gap between two adjacent first memory cells.

According to the aforementioned method of fabricating non-volatile memory in the embodiment of the present invention, one of the source/drain regions is formed in the substrate between the first memory cell column and the second memory cell column.

According to the aforementioned method of fabricating non-volatile memory in the embodiment of the present invention, the width of the two outermost first memory cells is larger than the other first memory cells.

According to the aforementioned method of fabricating non-volatile memory in the embodiment of the present invention, each first memory cell comprises, from the substrate level up, a first composite layer, a first gate and a cap layer. The first composite layer includes a first charge storage layer.

According to the aforementioned method of fabricating non-volatile memory in the embodiment of the present invention, the material constituting each first gate includes doped polysilicon or polysilicon silicide (or polycide).

According to the aforementioned method of fabricating non-volatile memory in the embodiment of the present invention, the material constituting the first charge storage layer and the second charge storage layer includes silicon nitride or doped polysilicon.

According to the aforementioned method of fabricating non-volatile memory in the embodiment of the present invention, the cap layer includes a silicon oxide layer, a silicon nitride layer or a stack layer comprising a silicon oxide layer and a silicon nitride layer.

According to the aforementioned method of fabricating non-volatile memory in the embodiment of the present invention, each first composite layer and second composite layer comprises a bottom dielectric layer and a top dielectric layer.

According to the aforementioned method of fabricating non-volatile memory in the embodiment of the present invention, the method of patterning the dielectric layer includes performing an anisotropic etching process.

According to the aforementioned method of fabricating non-volatile memory in the embodiment of the present invention, the material constituting the charge storage layer includes silicon nitride or doped polysilicon.

In the method of fabricating non-volatile memory according to the present invention, a second composite layer and a conductive layer are formed in the gap between the stack gate structures. Because there is no need to perform photolithographic and etching processes to produce another type of gate structures between the stack gate structures, high-density memory cells are produced. Furthermore, there is no need to use a photomask to pattern out the second gates. Hence, the fabrication process is simplified and the production cost is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A through 1G are schematic cross-sectional views showing the steps for fabricating a non-volatile memory according to one embodiment of the present invention.

DESCRIPTION OF THE PREFERRED EMBODIMENTS

Figure 1A:
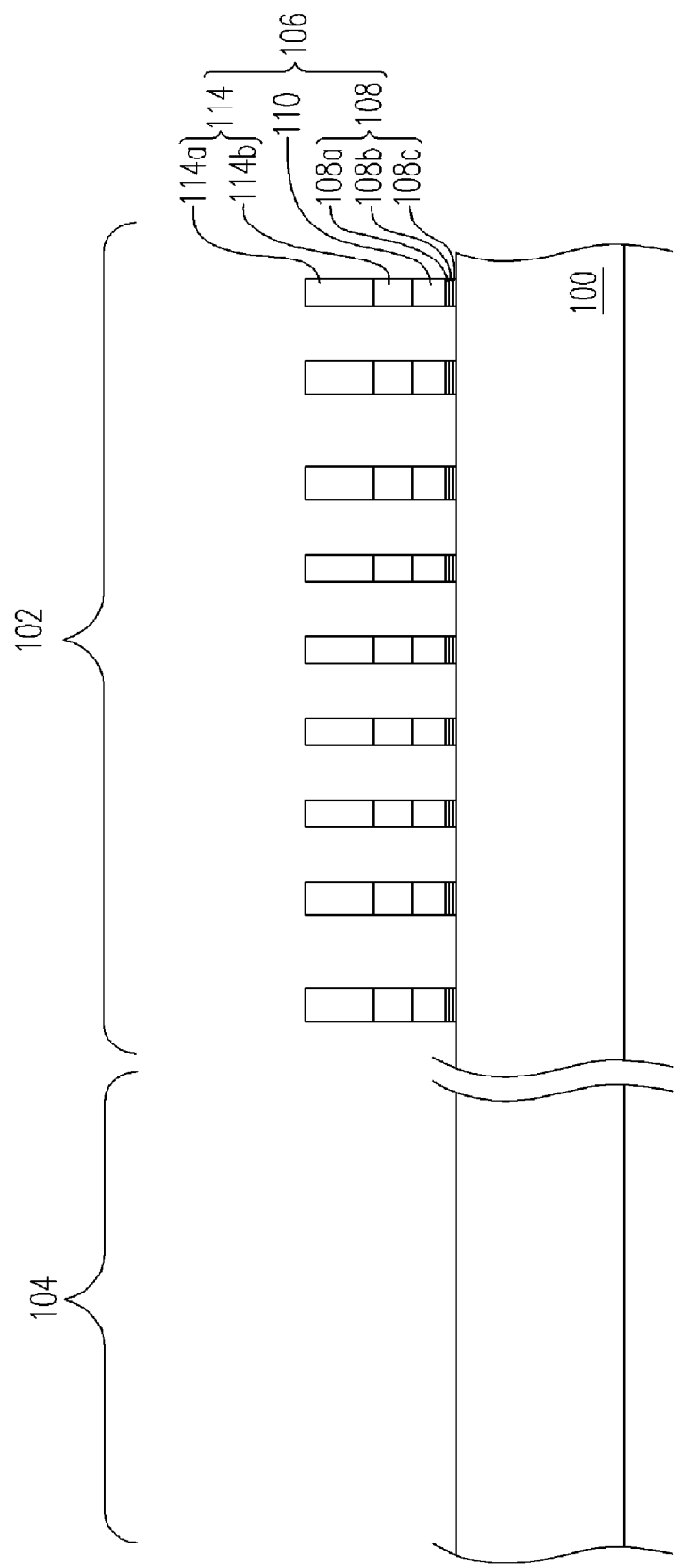

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1G are schematic cross-sectional views showing the steps for fabricating a non-volatile memory according to one embodiment of the present invention. First, as shown in FIG. 1A, a substrate 100 such as a silicon substrate is provided. The substrate 100 can be divided at least into a memory cell region 102 and a peripheral circuit region 104. Then, a plurality of memory cells 106 is formed over the substrate 100 in the memory cell region 102. Each memory cell 106 comprises a composite layer 108, a gate 110 and a cap layer 114. The method of forming the memory cells 106 includes sequentially forming a composite dielectric material layer, a conductive layer and an insulating material layer over the substrate 100. Then, a patterned photoresist layer (not shown) is formed over the memory cell region 102. Thereafter, an etching process is carried out to pattern the material layer in the memory cell region 102 and remove the material layer in the peripheral circuit region 104. Finally, the patterned photoresist layer is removed.

It should be noted that, in the subsequent process of forming various memory cell columns, the width of the two outermost memory cells 106 is larger than the width of the other memory cells 106 in the memory cell column. This prevents the doping range of the subsequently formed source/drain regions from exceeding the outermost memory cells 106 of the memory cell column and leading to defects in electrical performance.

Each composite layer 108 comprises a bottom dielectric layer 108c, a charge storage layer 108b and a top dielectric layer 108a. The bottom dielectric layer 108c is a silicon oxide formed, for example, by performing a thermal oxidation process. The charge storage layer 108b is a silicon nitride layer or a doped polysilicon layer formed, for example, by performing a chemical vapor deposition process. The cap dielectric layer 108a is another silicon oxide layer formed, for example, by performing a chemical vapor deposition process. Obviously, the bottom dielectric layer 108c and the top dielectric layer 108a can be fabricated using other materials. In addition, the material constituting the charge storage layer 108b is also not limited to silicon nitride or doped polysilicon. Other material capable of trapping electric charges including, for example, tantalum oxide, strontium titanate and hafnium oxide, can be used.

The gate 110 is fabricated using doped polysilicon, for example. The method of forming the gate 110 includes depositing undoped polysilicon material to form an undoped polysilicon layer in a chemical vapor deposition process and performing an ion implant process thereafter. In another embodiment, the gate 110 can be a polysilicon silicide (polycide) comprising a doped polysilicon layer and a silicide layer, for example. The polycide layer is formed, for example, by depositing doped polysilicon material to form a doped polysilicon layer and performing a chemical vapor deposition process to form a silicide layer thereafter. The material constituting the silicide layer may include nickel silicide or tungsten silicide, for example.

The cap layer 114 can be a silicon oxide layer, a silicon nitride layer or a stack layer comprising a silicon oxide layer and a silicon nitride layer. In the present embodiment, the cap layer 114 is a stack layer comprising a silicon oxide layer 114b and a silicon nitride layer 114a, for example. The silicon nitride layer 114a can serve as a hard mask layer. The method of forming the cap layer 114 includes depositing silicon oxide using tetra-ethyl-ortho-silicate (TEOS)/ozone ($O_3$) as reactive gases in a chemical vapor deposition process to form the silicon oxide layer 114b. Thereafter, silicon nitride material is disposed over the silicon oxide layer 114b to form the silicon nitride layer 114a in a chemical vapor deposition process.

Figure 1B:
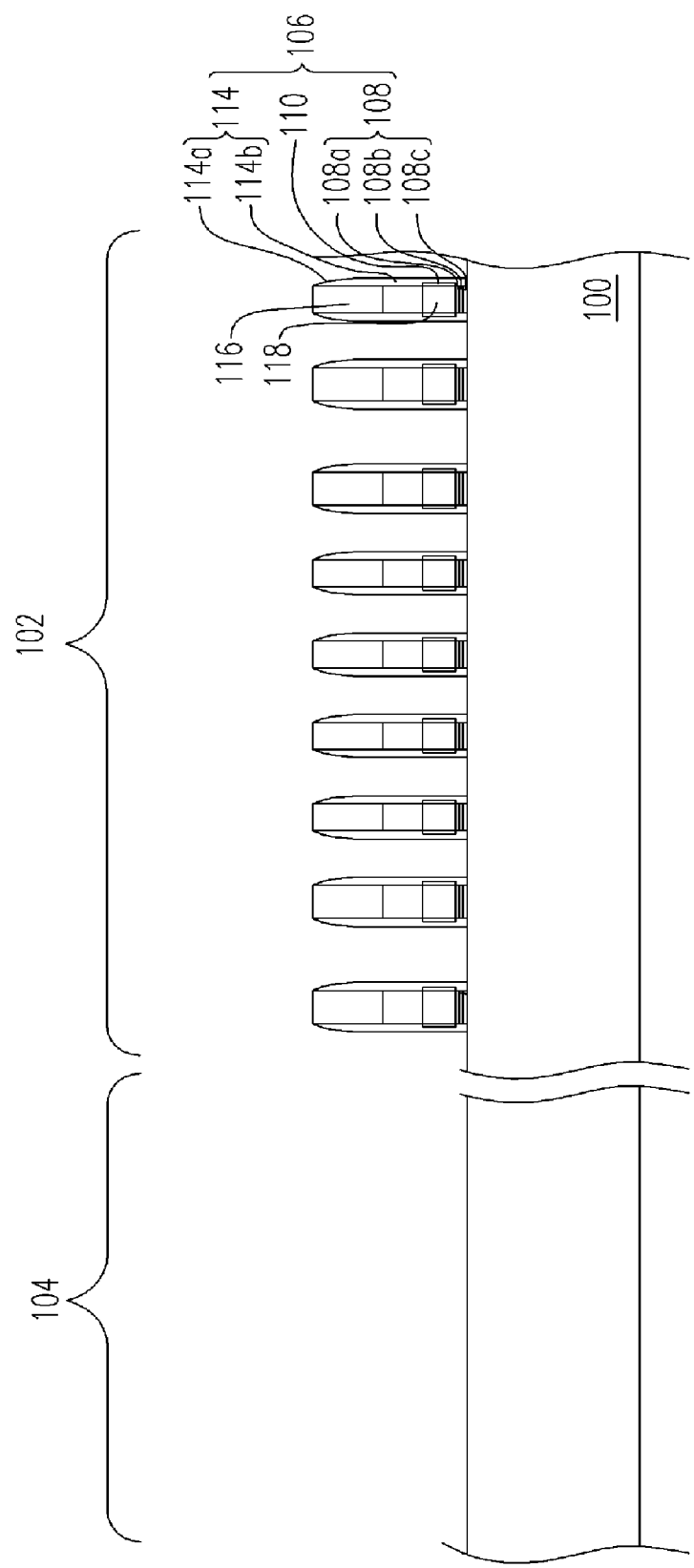

As shown in FIG. 1B, spacers 116 are formed on the respective sidewalls of the memory cells 106. The spacers 116 are formed, for example, by depositing insulating material to form an insulating material layer and then performing an anisotropic etching process to remove the insulating material layer so that only a portion of the insulating material layer is retained on the sidewalls of the memory cells 106. The material constituting the spacers 116 includes silicon nitride, for example. In another embodiment, a rapid thermal annealing process is also carried out after forming the memory cells 106 but before forming the spacers so that a liner oxide layer 118 is formed on the sidewalls of the gates 110 and the silicide layer 112.

As shown in FIG. 1C, a composite layer 120 is formed over the substrate 100. The composite layer 120 comprises, for example, a bottom dielectric layer 120a, a charge storage layer 120b and a top dielectric layer 120c. Since the material constituting the composite layer 120 and the method of forming the composite layer 120 are similar to the composite layer 108, a detailed description is omitted.

Thereafter, a conductive layer 122 is formed over the substrate 100 to cover the memory cells 106 and fill the gaps between adjacent memory cells 106. The conductive layer 122 is fabricated using doped polysilicon, for example. The conductive layer 122 is formed, for example, by depositing undoped polysilicon in a chemical vapor deposition process to form an undoped polysilicon layer and performing an ion implant process thereafter.

Figure 1D:
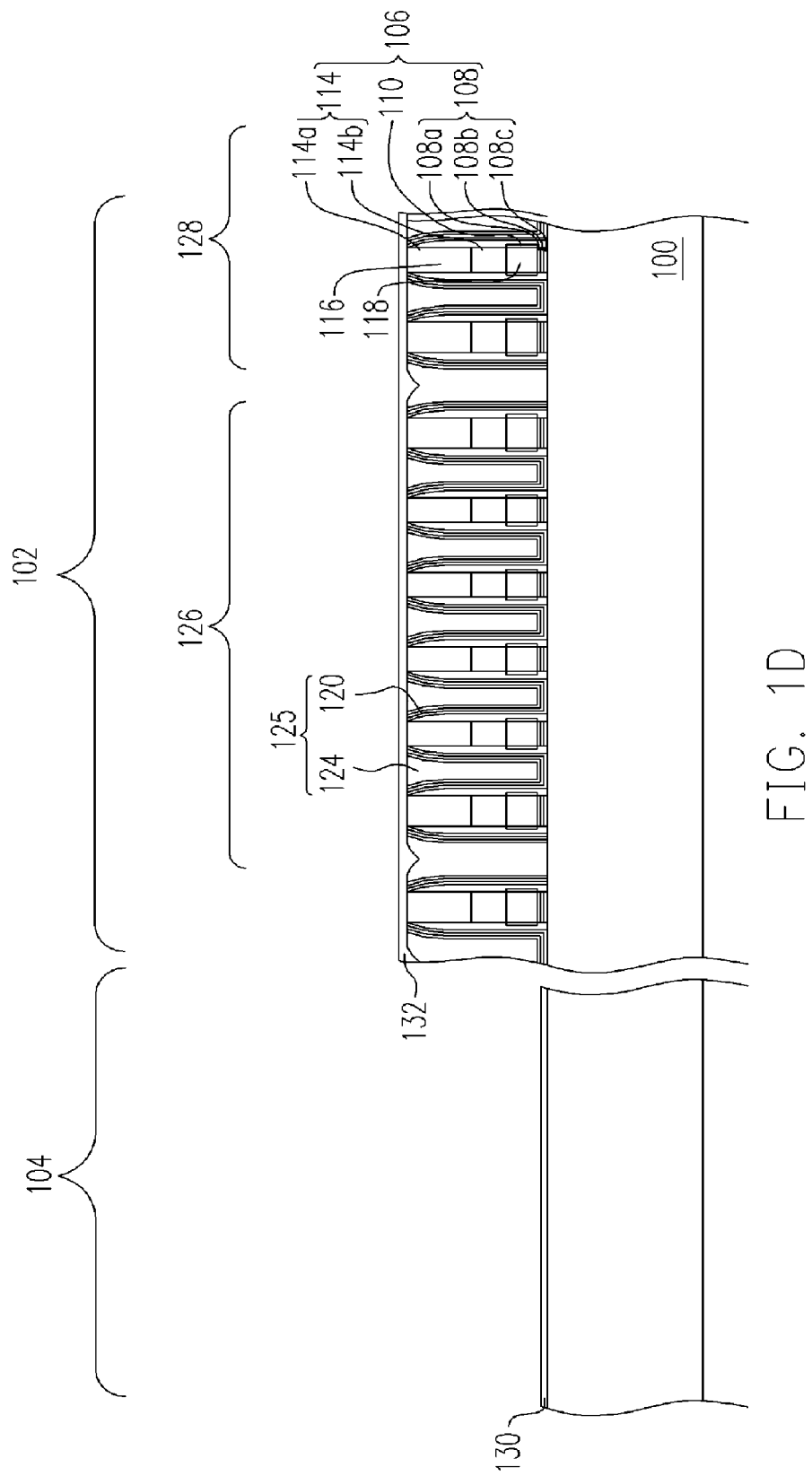

As shown in FIG. 1D, a removing step is carried out to remove the conductive layer 122 and the composite layer 120 in the peripheral circuit region 104 and a portion of the conductive layer 122 and the composite layer 120 in the memory cell region 102. The removing step is an etching process carried out using the cap layer 114 as an etching stop layer, for example. Hence, the upper surface of the memory cells 106 is exposed and a plurality of gates 124 that fills the gaps is formed.

After the removing step, the gates 124 and the composite layer 120 together constitute a plurality of memory cells 125.

It should be noted that the gates 124 are formed by filling the gaps between the memory cells 106 with conductive material and etching back the material and hence there is no need to use a photomask to define the gates 124 in the conductive layer 122. Consequently, aside from simplifying the production process, the process also reduces overall production cost.

The memory cells 125 together with the memory cells 106 form a plurality of memory cell columns. In the present embodiment, the memory cell columns 126 and 128 are used in the explanation. The distance between the memory cell columns 126 and 128 is wider than the gap between adjacent memory cells 106. The larger distance between the memory cell columns facilitates the formation of plugs in a subsequent interconnect process.

Thereafter, a gate dielectric layer 130 is formed over the substrate 100 in the peripheral circuit region 104. At the same time, an oxide layer 132 is also formed over the upper surface of the memory cells 106 and the gates 124 in the memory cell region 102. The gate dielectric layer 130 and the oxide layer 132 are fabricated using silicon oxide in a thermal oxidation process, for example.

In another embodiment, before forming the gate dielectric layer 130 over the substrate 100 in the peripheral circuit region 104, the substrate 100 in the peripheral circuit region 104 can be cleaned using a solution containing hydrofluoric acid (HF), for example. The cleaning step serves to produce a gate dielectric layer 130 with a higher quality on the substrate 100 in the peripheral circuit region 104.

Figure 1E:
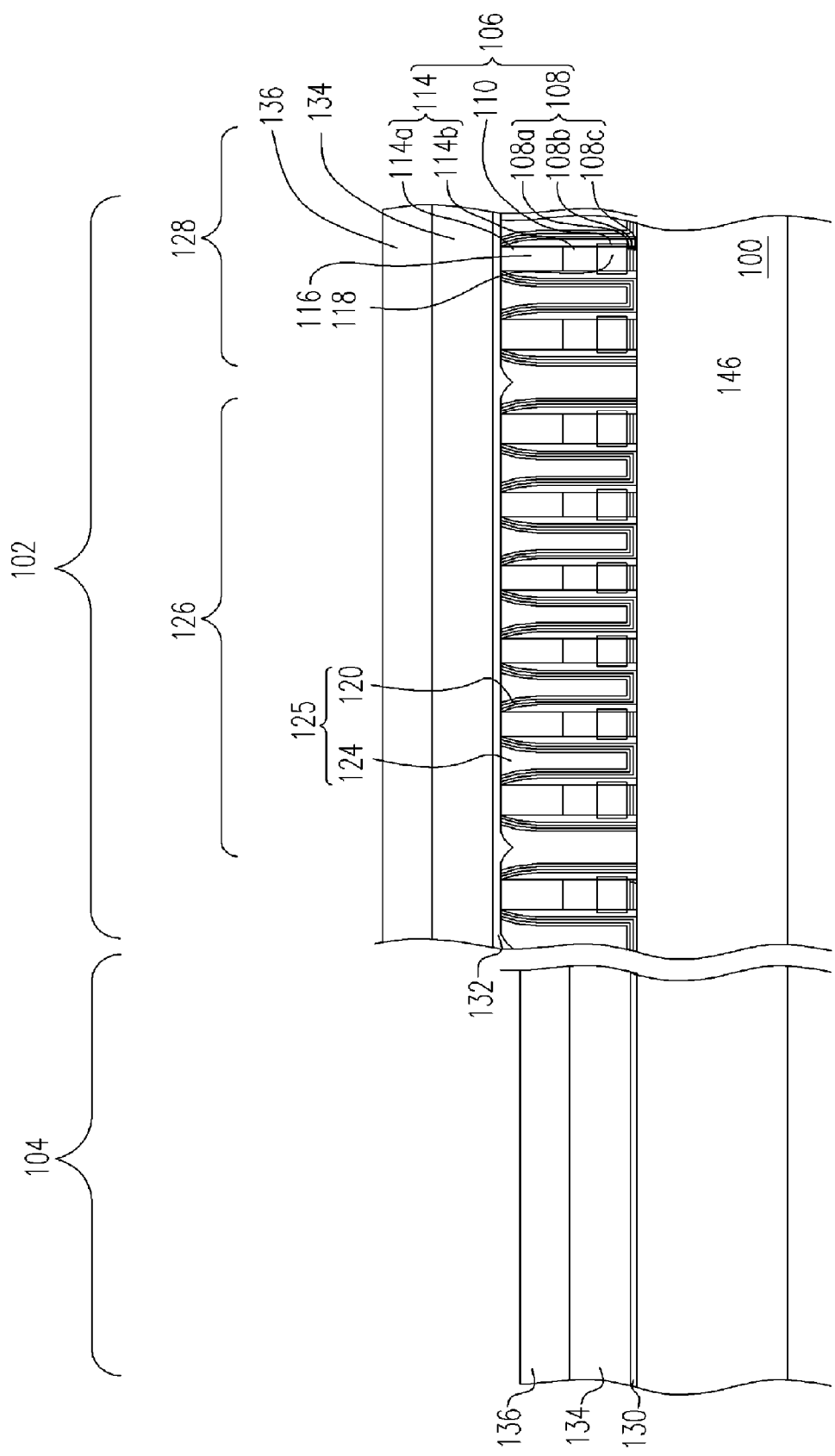

As shown in FIG. 1E, a conductive layer 134 is formed over the substrate 100 to cover the gate dielectric layer 130 in the peripheral circuit region 104 and to cover the memory cells 106 and the gates 124 in the memory cell region 102. The conductive layer 134 is a doped polysilicon layer formed, for example, by depositing undoped polysilicon material in a chemical vapor deposition process to form an undoped polysilicon layer and performing an ion implant process thereafter.

Thereafter, a dielectric layer 136 is formed over the conductive layer 134. The dielectric layer 136 is formed, for example, by performing a chemical vapor deposition process using tetra-ethyl-ortho-silicate (TEOS)/ozone ($O_3$) as the reactive gases.

Figure 1F:
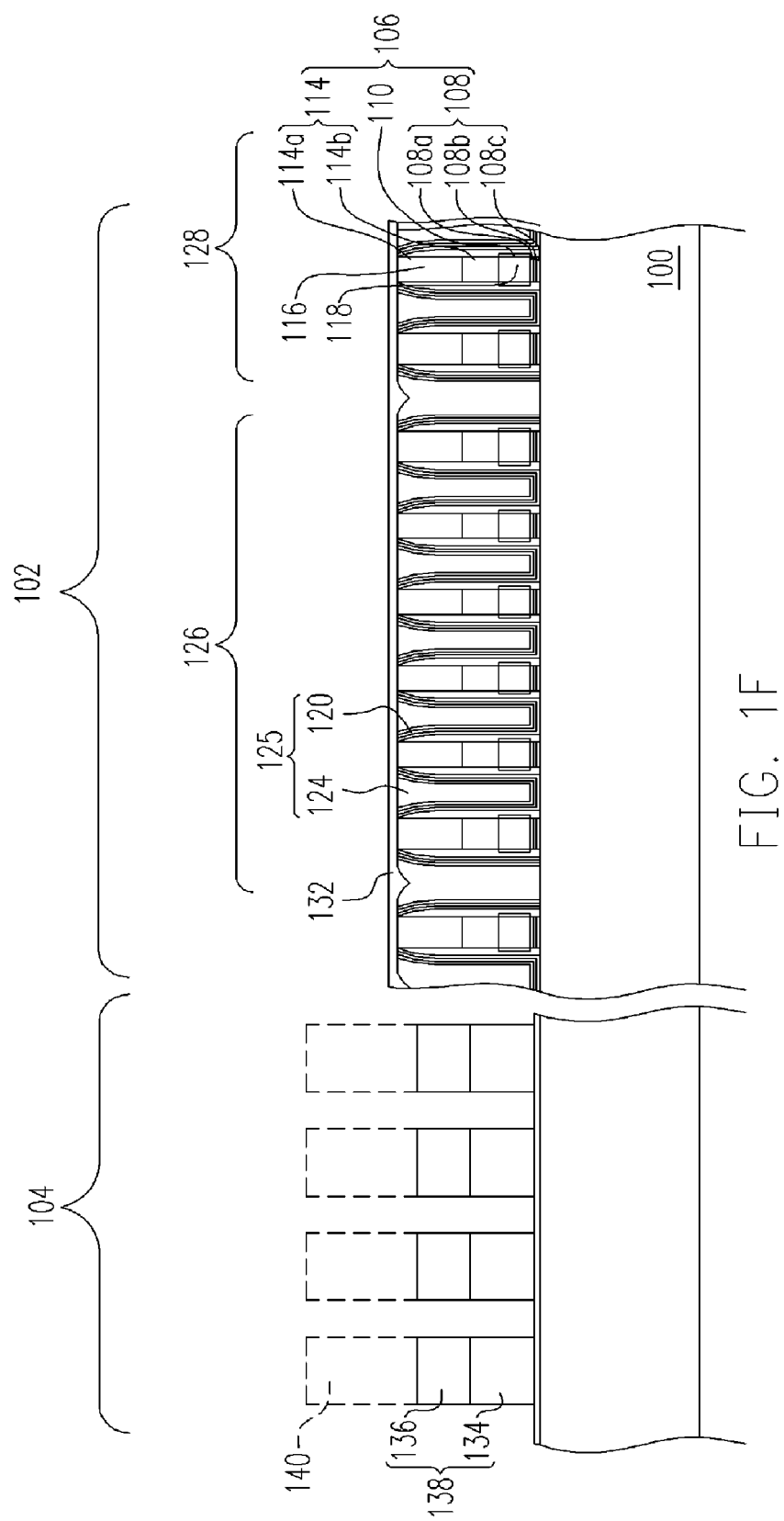

As shown in FIG. 1F, the dielectric layer 136 and the conductive layer 134 in the peripheral circuit region 104 are patterned to form a plurality of gate structures 138 and the dielectric layer 136 and the conductive layer 134 in the memory cell region 102 are removed. The patterning process includes the following steps. First, a patterned photoresist layer 140 is formed over the dielectric layer 136. Then, using the patterned photoresist layer 140 as a mask and the gate dielectric layer 130 in the peripheral circuit region 104 and the oxide layer 132 in the memory cell region 102 as an etching stop layer, an anisotropic etching process is performed. Finally, the patterned photoresist layer 140 is removed.

Figure 1G:
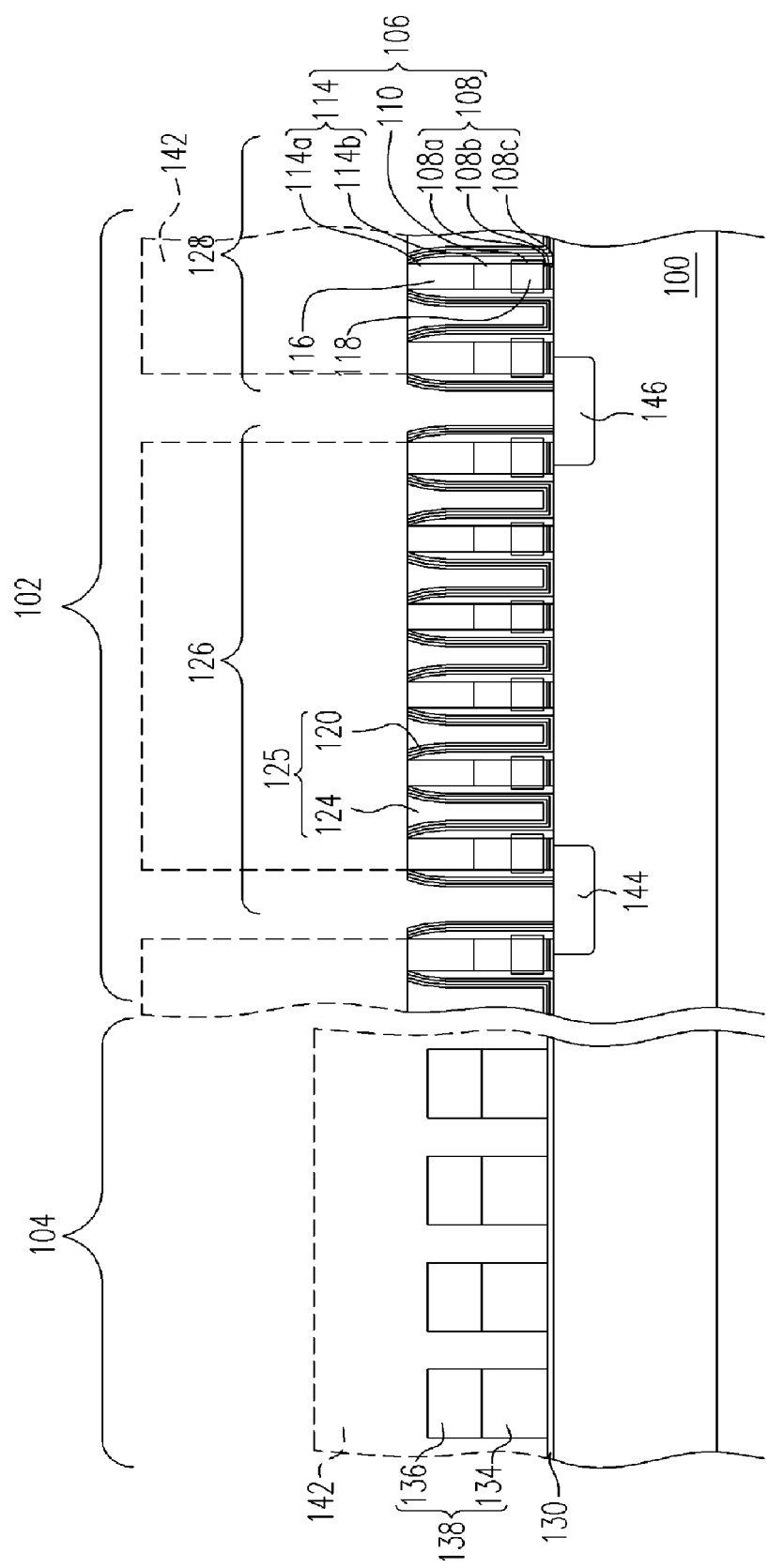

As shown in FIG. 1G, another patterned photoresist layer 142 is formed over the substrate 100 to expose the areas for forming source/drain regions. Thereafter, an anisotropic etching process is performed to remove the oxide layer 132, the gate 124 and the composite layer 108 above the areas for forming the source/drain regions.

Then, using the patterned photoresist layer 142 as a mask, a dopant implant process is carried out to form a source region 144 and a drain region 146 in the substrate 100 on the respective sides of the memory cell column. In other words, the source region 144 and the drain region 146 are disposed in the substrate 100 between two adjacent memory cell columns. Thereafter, the patterned photoresist layer 142 is removed. Since the subsequent processes for forming a complete non-volatile memory should be familiar to those skilled in this area, a detailed description is omitted.

In the aforementioned embodiment, the composite layer 120 and the gates 124 are formed in the gaps between the memory cells 106. Hence, gate structures are formed between the memory cells 106 without performing photolithographic and etching processes, thereby increasing the density of the memory cells. Furthermore, the fabricating process is simpler and can reduce production cost.

In summary, the present invention has at least the following advantages.

1. The method of fabricating non-volatile memory in the present invention allows another type of gate structures to be formed in the gap between the gate structures in the memory cell region so that non-volatile memory can have a higher device packing density.

2. The processes for forming the memory cell region and the peripheral circuit region can be integrated together to simplify the non-volatile memory fabrication process.

3. The width of the two outermost gate structures in the memory cell row is increased to prevent the doping range of the source/drain regions from exceeding the outermost gate structures of the memory cell column and hence minimize defective electrical properties.

4. The other type of gate structures formed between the gate structures in the memory cell region is fabricated without using a mask. Hence, the process of fabricating the non-volatile memory is simplified so that the production cost can be reduced.

5. The adjacent memory cell columns in the present invention have a larger distance than the adjacent memory cells to facilitate the formation of plugs in a subsequent interconnect process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating non-volatile memory, comprising the steps of:
   providing a substrate having a memory cell region and a peripheral circuit region;
   forming a plurality of first memory cells on the substrate in the memory cell region, wherein every pair of adjacent first memory cells has a gap;
   forming a first composite layer over the substrate, wherein the first composite layer includes a second charge storage layer;
   forming a first conductive layer over the substrate to cover the first memory cells and fill up the gaps;
   removing the first conductive layer and the first composite layer in the peripheral circuit region and removing a portion of the first conductive layer in the memory cell region so that a plurality of second gates is formed to fill the gaps in the memory cell region, wherein the second gates and the first composite layer form a plurality of second memory cells and the second memory cells and the first memory cells form a first memory cell column;
   forming a gate dielectric layer over the substrate in the peripheral circuit region;
   forming a second conductive layer over the substrate to cover the gate dielectric layer in the peripheral circuit region and to cover the first memory cell column in the memory cell region;
   forming a dielectric layer over the second conductive layer;
   patterning the dielectric layer and the second conductive layer to form a plurality of gate structures in the peripheral circuit region and removing the dielectric layer the second conductive layer in the memory cell region; and
   forming source/drain regions in the substrate on the respective sides of the first memory cell column.

2. The method of claim 1, wherein the removing step includes performing an etching back process using the first memory cells as an etching stop layer.

3. The method of claim 1, wherein before forming the first composite layer, further includes forming spacers on the respective sidewalls of the first memory cells.

4. The method of claim 1, wherein after performing the removing step but before forming the gate dielectric layer in the peripheral circuit region, further includes cleaning the substrate in the peripheral circuit region.

5. The method of claim 1, wherein the step of forming source/drain regions in the substrate includes performing an ion implant process.

6. The method of claim 1, further comprising forming a second memory column next to the first memory column on the substrate.

7. The method of claim 1, wherein the width of the two outermost first memory cells in the first memory cell column is larger than the other first memory cells.

8. The method of claim 1, wherein each first memory cell comprises, from the substrate upward, a second composite layer, a first gate and a cap layer such that the second composite layer includes a first charge storage layer.

9. The method of claim 1, wherein the step of patterning the dielectric layer includes performing an anisotropic etching process.

10. The method of claim 3, wherein after forming the first memory cells but before forming the spacers, further includes forming a liner oxide layer on the respective sidewalls of the first memory cells.

11. The method of claim 10, wherein the step of forming the liner oxide layer includes performing a rapid thermal annealing process.

12. The method of claim 4, wherein the cleaning process includes rinsing with a hydrofluoric acid solution.

13. The method of claim 6, wherein the distance between the first memory cell column and the second memory cell column is wider than the gap between two adjacent first memory cells.

14. The method of claim 6, wherein one of the source/drain regions is formed in the substrate between the first memory cell column and the second memory cell column.

15. The method of claim 8, wherein the material constituting the first gate includes doped polysilicon or polysilicon silicide (polycide).

16. The method of claim 8, wherein the material constituting the first charge storage layer and the second charge storage layer includes silicon nitride or doped polysilicon.

17. The method of claim 8, wherein the cap layer includes a silicon oxide layer, a silicon nitride layer or a stack layer comprising a silicon oxide layer and a silicon nitride layer.

18. The method of claim 8, wherein each first composite layer and each second composite layer comprises a bottom dielectric layer and a top dielectric layer.

19. The method of claim 18, wherein the material constituting the bottom dielectric layer and the top dielectric layer includes silicon oxide.

* * * * *